United States Patent
Ishimaru

(10) Patent No.: US 7,921,386 B2
(45) Date of Patent: Apr. 5, 2011

(54) FABRICATION METHOD FOR SEMICONDUCTOR DEVICE, EXPOSURE METHOD, PATTERN CORRECTION METHOD AND SEMICONDUCTOR DEVICE

(75) Inventor: Toshiyuki Ishimaru, Kanagawa (JP)

(73) Assignee: Sony Corporation, Tokyo (JP)

( * ) Notice: Subject to any disclaimer, the term of this patent is extended or adjusted under 35 U.S.C. 154(b) by 436 days.

(21) Appl. No.: 12/108,660

(22) Filed: Apr. 24, 2008

(65) Prior Publication Data
US 2008/0268554 A1    Oct. 30, 2008

(30) Foreign Application Priority Data
Apr. 27, 2007 (JP) ................. 2007-117847

(51) Int. Cl.
*G06F 17/50* (2006.01)
(52) U.S. Cl. ........... 716/50; 716/51; 716/52; 716/54
(58) Field of Classification Search ........... 716/19–21, 716/50–52, 54; 430/5, 22, 30
See application file for complete search history.

(56) References Cited

U.S. PATENT DOCUMENTS
7,003,757 B2 * 2/2006 Pierrat et al. ............. 716/19

FOREIGN PATENT DOCUMENTS

| JP | 09-293661   | 11/1997 |
|----|-------------|---------|
| JP | 2001-015419 | 1/2001  |
| JP | 2001-093818 | 6/2001  |
| JP | 2004-200509 | 1/2004  |
| JP | 2007-067018 | 3/2007  |

OTHER PUBLICATIONS

Office Action issued by the Japanese Patent Office on May 12, 2009 in connection to related Japanese Patent Application No. 2007-117847.

* cited by examiner

*Primary Examiner* — Paul Dinh
(74) *Attorney, Agent, or Firm* — SNR Denton US LLP

(57) ABSTRACT

Disclosed herein is a fabrication method for a semiconductor device, including a lithography step of connecting a plurality of mask patterns to each other to form a pattern image of an area greater than the size of the mask patterns. The lithography step includes the steps of: assuring an overlapping exposure region to be exposed in an overlapping relationship by both of two mask patterns to be connected to each other, carrying out exposure transfer of the pattern portions of the two mask patterns to the overlapping exposure region to form a first measurement mark and a second measurement mark in the overlapping exposure region, and carrying out positional displacement measurement of pattern connection by the two mask patterns based on a manner of combination of main marks and sub marks of the measurement marks formed in the overlapping exposure region.

5 Claims, 6 Drawing Sheets

FABRICATION METHOD FOR SEMICONDUCTOR DEVICE, EXPOSURE METHOD, PATTERN CORRECTION METHOD AND SEMICONDUCTOR DEVICE

CROSS REFERENCES TO RELATED APPLICATIONS

The present invention contains subject matter related to Japanese Patent Application JP 2007-117847 filed in the Japan Patent Office on Apr. 27, 2007, the entire contents of which being incorporated herein by reference.

BACKGROUND OF THE INVENTION

1. Field of the Invention

This invention relates to a fabrication method for a semiconductor device including a lithography step, an exposure method for forming a pattern image by exposure transfer of an original pattern, a pattern correction method used for exposure transfer of a pattern image, and a semiconductor device obtained using a lithography step.

2. Description of the Related Art

Usually, a semiconductor device is fabricated using a lithography step. At the lithography step, a circuit pattern formed on a glass original plate called mask or reticle (hereinafter referred to merely as "mask") is transferred by exposure to a wafer substrate, to which a photosensitive resin material called resist is applied, using an exposure apparatus, and then the transferred pattern is developed. The circuit pattern is formed on the wafer substrate thereby.

In some semiconductor device fabricated through the lithography step, a circuit pattern is divisionally drawn at the lithography step because it has a great chip length, for example, like a CCD (Charge Coupled Device) line sensor used for a copying machine or a scanner apparatus. In particular, at the lithography step, an entire pattern of a semiconductor device to be formed is divided into a plurality of patterns, and the divisional patterns are disposed in an exposure field of an exposure apparatus and connected to each other on a wafer substrate to draw a chip pattern of the semiconductor device of a great size. As a result, a semiconductor device having a chip length greater than that of the exposure area of the exposure apparatus can be drawn on a wafer substrate. The technique described is disclosed, for example, in Japanese Patent Laid-Open No. Hei 9-293661.

SUMMARY OF THE INVENTION

Incidentally, when divisional drawing of a pattern is carried out at the lithography step, a connection region of divisional patterns appears on a wafer substrate. There is the possibility that, in such a connection region as just mentioned, positional displacement between the divisional patterns may be caused by a drawing position error upon pattern formation arising from an error in fabrication of a mask, distribution or aberration arising from an optical system of the exposure apparatus, accuracy in measurement of a laser interferometer arising from a stage to which the wafer substrate is to be set, distortion of the array accuracy and so forth.

In a line sensor, an area sensor or the like which is generally formed from pixels of a size of approximately 10 μm, such pattern positional displacement in a connection region as described above can be prevented from having an influence on a circuit pattern by designing the circuit pattern so that the position displacement may not have an influence on the circuit pattern.

However, in recent years, refinement and so forth of pixels of a semiconductor device are demanded strongly, and a line sensor, an area sensor and so forth formed from pixels of the size of approximately 2 to 7 μm are demanded. In this instance, if a circuit pattern is designed so as to have a considerable margin in order to prevent such positional displacement as described above from having an influence on the circuit pattern, then there is the possibility that the region of a photo-sensor disposed in each pixel may be reduced, resulting in deterioration of the sensitivity of the sensor. Such deterioration of the sensitivity may give rise to increase of the exposure time, drop of the S/N ratio of the sensor and so forth and may make a cause of deterioration of the performance of the semiconductor device.

Therefore, it is desirable to provide a fabrication method for a semiconductor device, an exposure method, a pattern correction method and a semiconductor device by which, even where patterns are connected to each other to form a pattern image of a size greater than the size of the patterns, the accuracy in connection of the patterns can be raised and refinement of a semiconductor device can be implemented thereby without the necessity to increase the margin in design of the patterns.

According to embodiments of the present invention, there is provided a fabrication method for a semiconductor device, including a lithography step of connection a plurality of mask patterns to form a pattern image of an area greater than the size of the mask patterns, the lithography step including the steps of assuring an overlapping exposure region to be exposed in an overlapping relationship by both of two mask patterns to be connected to each other, disposing, on one of the two mask patterns, a pattern portion corresponding to a main mark of a first measurement mark formed from a combination of the main mark and a sub mark and a pattern portion corresponding to a sub mark of a second measurement mark having a same configuration as that of the first measurement mark and positioned at a position different from that of the first measurement mark, disposing, on the other one of the two mask patterns, a pattern portion corresponding to the sub mark of the first measurement mark and a pattern portion corresponding to the main mark of the second measurement mark, carrying out exposure transfer of the pattern portions of the two mask patterns to the overlapping exposure region to form the first measurement mark and the second measurement mark in the overlapping exposure region, and carrying out positional displacement measurement of pattern connection by the two mask patterns based on a manner of combination of the main marks and the sub marks of the measurement marks formed in the overlapping exposure region.

In the fabrication method for a semiconductor device, a pattern image is formed by connection of mask patterns. Further, a first measurement mark formed from a combination of a main mark and a sub mark and a second measurement mark having a same configuration as that of the first measurement mark and positioned at a position different from that of the first measurement mark are formed in an overlapping exposure region to be exposed in an overlapping relationship by both of two mask patterns to be connected to each other. Accordingly, for example, by measuring the position of the main marks and the sub marks and quantitatively recognizing the combination mode of the main marks and the sub marks such that the displacement amount of the sub marks from their original positions where the main marks are taken as a reference is recognized, positional displacement measurement of the pattern connection of the two mask patterns can be carried out.

Besides, since the first and second measurement marks are disposed such that the main mark and the sub mark of one and the other of the first and second measurement marks are disposed on one of the two mask patterns while the sub mark and the main mark which are to be combined with the main mark and the sub mark disposed on the one of the two mask patterns, respectively, are disposed on the other of the two mask patterns, the degree by which positional displacement measurement is carried out relying upon the main mark of one of the two main marks can be suppressed. As a result, even if the mask patterns suffer from a fabrication error, the influence of the error can be eliminated to enhance the accuracy of the positional displacement measurement.

With the fabrication method for a semiconductor device, even where pattern connection is to be carried out, since positional displacement measurement of the connection can be carried out accurately. Therefore, the accuracy in connection of the patterns can be raised by carrying out pattern correction based on a result of the measurement. Accordingly, the margin in design of the patterns need not be increased, which is very effective to implementation of refinement of a semiconductor device. If refinement of a semiconductor device becomes possible, then, for example, in a case wherein an image sensor is configured, reduction in scale and increase in density of pixels of the sensor can be implemented. As a result, enhancement of the performance of the sensor can be achieved.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

Figure 1:
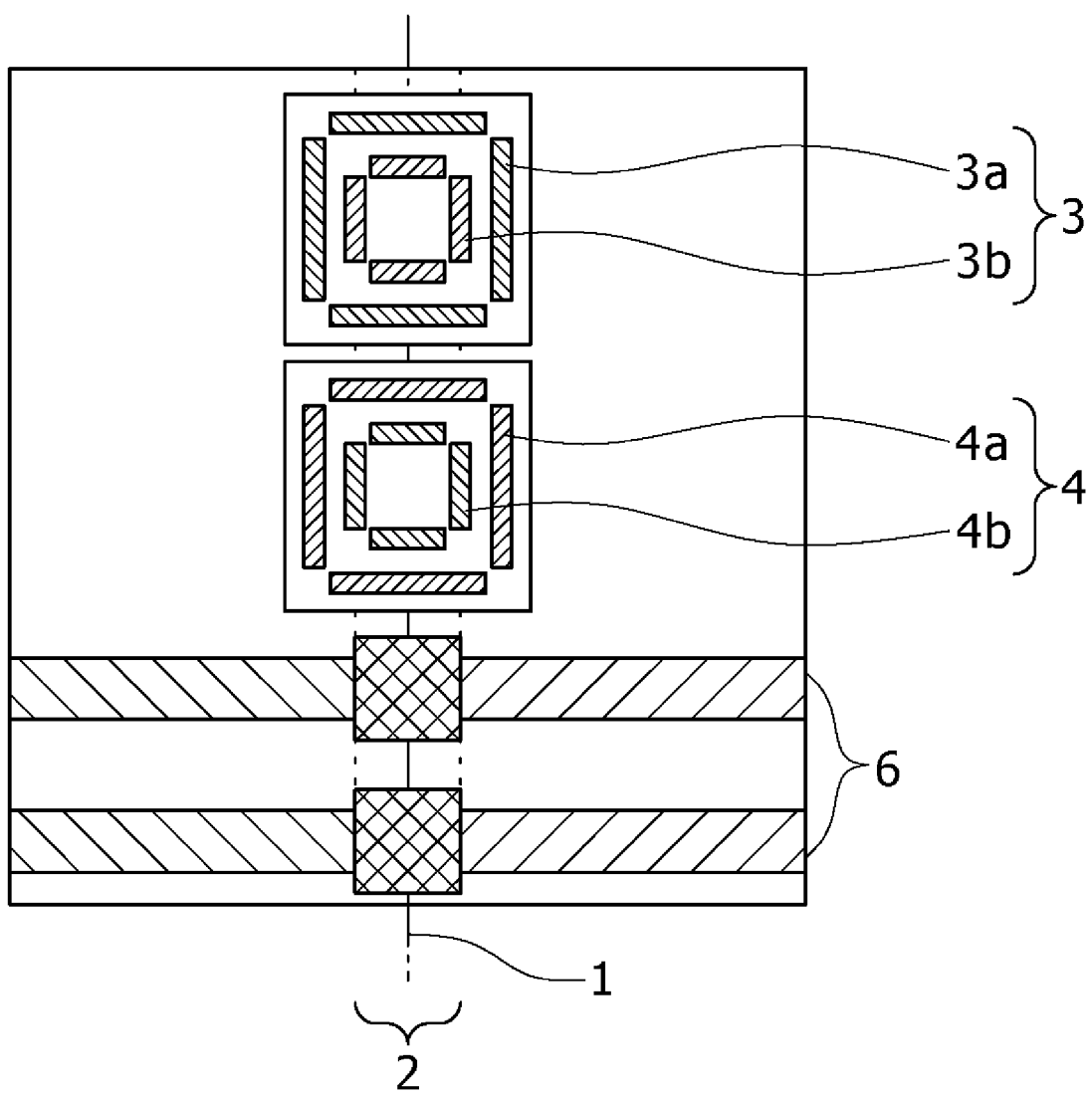
FIG. 1 is a schematic view showing a particular example of a connection region to which the present invention is applied.

First, an outlines of a fabrication method for a semiconductor device according to embodiments of the present invention is described.

A general fabrication method for a semiconductor device includes various steps such as a lithography step, an etching step, a film deposition step, an ion implantation step, a washing step and a CMP (Chemical Mechanical Polishing) step. More particularly, a semiconductor film is deposited on a wafer substrate at the film deposition step, and then a circuit pattern of photoresist is formed at the lithography step. More particularly, a circuit pattern formed on a mask (such circuit pattern is hereinafter referred to simply as "mask pattern") is transferred by exposure to a wafer substrate, to which resist is applied, using an exposure apparatus at the lithography step. After a photoresist pattern is formed in this manner, it is transferred to a deposition film formed at the preceding steps at the etching step. Thereafter, the photoresist remaining on the wafer substrate is removed at the washing step. Then, next film deposition is carried out, and at the next lithography step, a photoresist pattern is formed in an overlapping relationship with the circuit pattern transferred at the preceding lithography step and etching step and further etching is carried out. Such a plurality of steps as described above are carried out repetitively to fabricate a semiconductor device.

One of semiconductor devices fabricated by such various steps as described above is a line-type sensor such as a CCD line sensor used in a copying machine, a scanner apparatus and so forth. The "line-type sensor" here is a sensor formed such that at least one side thereof in a longitudinal direction is greater than the dimension of the field area of an exposure apparatus which is used at the lithography step.

In order to fabricate such a line-type sensor as described above, it is necessary to connect, at the lithography step, mask patterns to each other to form a pattern image of a size greater than the size of the mask patterns. This similarly applies also to fabrication of an area sensor having dimensions in two-dimensional lengthwise and breadthwise directions greater than those of the field area of the exposure apparatus.

Incidentally, when exposure transfer of a mask pattern to a wafer substrate is carried out at the lithography step, positional displacement possibly occurs with the entire pattern. Further, when mask patterns are connected to each other to form a pattern image of an area greater than the size of the mask patterns, pattern positional displacement may occur at a connection portion between the mask patterns.

However, it is considered that positional displacement of the entire pattern is included in pattern positional displacement of a connection portion. Accordingly, it is earnestly desired that the pattern positional displacement at the connection portion can be measured with a high degree of accuracy without being influenced by the positional displacement of the entire pattern.

Therefore, at the lithography step described below by way of an example, exposure transfer of a mask pattern to a wafer substrate is carried out in such a procedure ad described below.

FIG. 1 illustrates a particular example of a connection region to which the present invention is applied.

Referring to FIG. 1, if different mask patterns are connected to each other, then a boundary line 1 of the patterns exists between the two mask patterns connected to each other. The boundary line 1 is used as a reference when patterns are to be designed, that is, when a circuit pattern positioned on the left side in FIG. 1 with respect to the boundary line 1 and a circuit pattern positioned on the right side in FIG. 1 are designed.

However, when connection of the mask patterns is carried out, not the patterns are merely juxtaposed in a mutually abutting state, but an overlapping exposure region 2 is assured in which both of the two mask patterns to be connected to each other are exposed in an overlapping relationship with each other. The overlapping exposure region 2 may have a width of, for example, approximately 0.2 to 1 µm.

Further, in the overlapping exposure region 2, measurement marks 3 and 4 to be used for measurement of positional displacement in pattern connection are formed. More particularly, a plurality of, for example, two, measurement marks 3 and 4 configured similarly to each other are formed at positions different from each other.

Each of the measurement marks 3 and 4 is formed from a combination of main marks and sub marks such that positional displacement between the main marks and the sub marks can be measured based on the position of the sub marks with reference to the main marks. In particular, bar-in-bar marks 3 and 4 are used which may each include outer bar marks 3a or 4a formed from bar-like marks or bar marks disposed in a rectangular shape and serving as the main marks and inner bar marks 3b or 4b formed from bar marks disposed in a rectangular shape in such a manner as to be surrounded by the outer bar marks 3a or 4a and serving as the sub marks. However, the measurement marks need not necessarily be the bar-in-bar marks 3 and 4, but any other known mark may be used for the measurement marks only if it can be used for measurement of positional displacement.

Pattern transfer to such a connection region as described above is carried out using an exposure mask of such a mask pattern as described below.

Figure 2A:
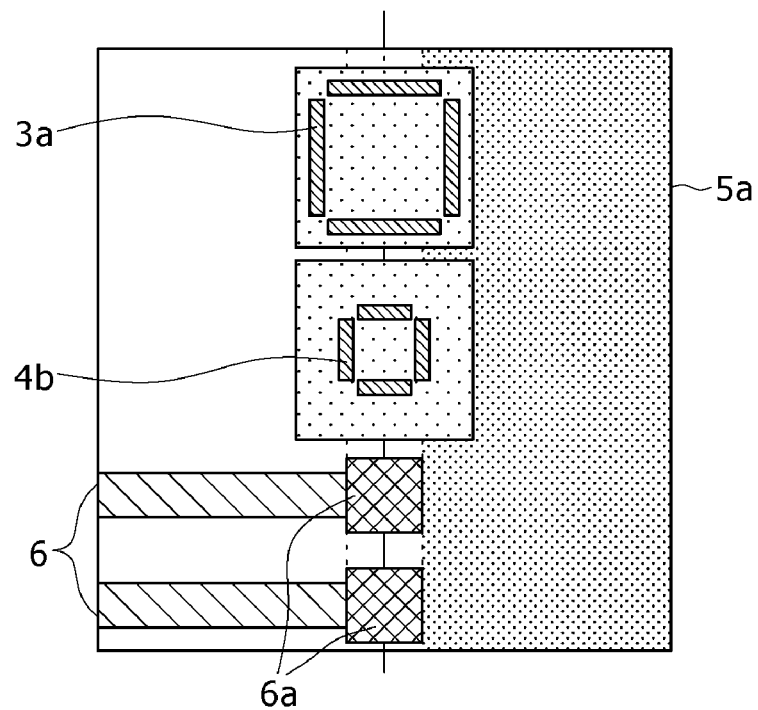
FIGS. 2A and 2B are schematic views showing a particular example of a mask pattern to which the present invention is applied.
Figure 2B:
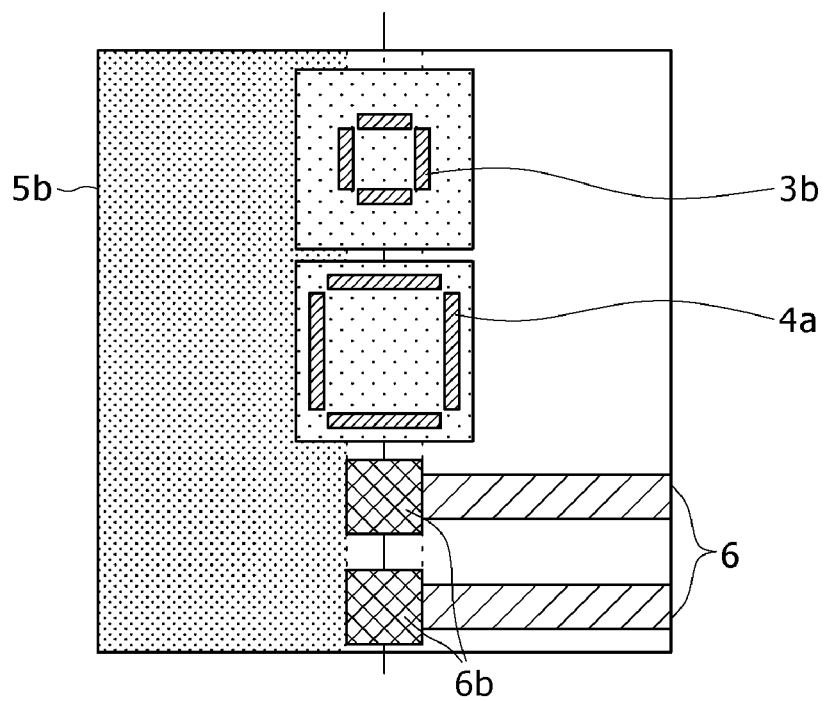

FIGS. 2A and 2B show a particular example of the mask patterns to which the present invention is applied.

FIG. 2A shows a mask pattern to be exposure transferred to a left side portion in FIG. 1 of the connection region of FIG. 1. Since the mask pattern shown in FIG. 2A is to be exposure transferred to the left side portion of the connection region, the right side region in FIG. 2A with respect to the overlapping exposure region 2 is covered with a light blocking film 5a for preventing exposure of an adjacent shot. Further, at a portion corresponding to the overlapping exposure region 2, a pattern portion corresponding to the outer bar marks 3a which are used as a reference for measurement of positional displacement with respect to the circuit portion in the right side region is disposed. Further, at another portion corresponding to the overlapping exposure region 2, a pattern portion corresponding to the inner bar marks 4b to be used for measurement of positional displacement where the circuit pattern in the right side region is used as a reference is disposed in such a manner that it is juxtaposed with the outer bar marks 3a.

It is to be noted that, in the portion corresponding to the overlapping exposure region 2, the line width of patterns 6a to be connected may be set greater than the line width outside the overlapping exposure region 2. In particular, the line width of the patterns 6a is made thicker, for example, by approximately 0.01 to 0.3 µm than the original line width of patterns 6. This is because this facilitates assurance of connection upon connection.

FIG. 2B shows a mask pattern to be exposure transferred to the right side portion in FIG. 1 of the connection region shown in FIG. 1. Since the mask pattern of the example shown is to be exposure transferred to the right side portion in FIG. 2B with respect to the connection region, the left side region in FIG. 2B with respect to the overlapping exposure region 2 is covered with a light blocking film 5b for preventing exposure of an adjacent short. Then, at a portion corresponding to the overlapping exposure region 2, pattern portions corresponding to the inner bar marks 3b to be used for measurement of positional displacement where the circuit pattern in the left side region is used as reference are disposed. The inner bar marks 3b are to be combined with the outer bar marks 3a shown in FIG. 2A in the mask pattern to be exposure transferred to the left side region. Further, at the portion corresponding to the overlapping exposure region 2, pattern portions corresponding to the outer bar marks 4a which are used as a reference for measurement of positional displacement with respect to the circuit pattern in the right side portion are disposed in a juxtaposed relationship with the inner bar marks 3b. The outer bar marks 4a are to be combined with the inner bar marks 4b shown in FIG. 2A in the mask pattern to be exposure transferred to the left side region.

It is to be noted that the line thickness of patterns 6b in the portion corresponding to the overlapping exposure region 2 may be set greater, for example, by approximately 0.01 to 0.3 µm than the line width outside the overlapping exposure region 2 similarly as in the case of the mask pattern to be exposure transferred to the left side region.

If the exposure masks of the mask patterns shown in FIGS. 2A and 2B are used to successively carry out exposure transfer, then such a transfer image as seen in FIG. 1 is formed in the overlapping exposure region 2. In other words, the bar-in-bar mark 3 composed of a combination of the outer bar marks 3a and the inner bar marks 3b and the bar-in-bar mark 4 composed of a combination of the outer bar marks 4a and the inner bar marks 4b are formed in a juxtaposed relationship with each other in a vertical direction in FIG. 1 in the overlapping exposure region 2.

Accordingly, if the positions of the outer bar marks 3a and 4a and the inner bar marks 3b and 4b of the bar-in-bar marks 3 and 4 of a transfer image are measured and the displacement amounts of the measured positions of the inner bar marks 3b and 4b from original positions of the inner bar marks 3b and 4b with reference to the outer bar marks 3a and 4a are recognized, then positional displacement measurement of the connection of the two adjacent portions across the overlapping exposure region 2 can be carried out. In other words, by quantitatively recognizing the combination mode between the outer bar marks 3a and 4a and the inner bar marks 3b and 4b, the positional displacement amount between the circuit pattern on the right wide with respect to the connection region and the circuit pattern on the left side with respect to the connection region can be calculated.

For the position measurement of the bar-in-bar marks 3 and 4, such a known method may be used that an image pickup section such as a CCD image sensor and a processing section for carrying out image analysis of a result of the image pickup by the image pickup section are used.

Since the two bar-in-bar marks 3 and 4 are involved, the positional displacement amount is obtained for each of the bar-in-bar marks 3 and 4. In other words, two positional displacement amounts are obtained. While the example described involves two bar-in-bar marks 3 and 4, if three or more bar-in-bar marks are involved, then three or more positional displacement amounts are obtained similarly.

After a plurality of positional displacement amounts are obtained in this manner, an average value of the positional displacement amounts is calculated. Then, a result of the calculation of an average value is tentatively determined as a positional displacement measurement result between the right side circuit pattern and the left side circuit pattern.

Incidentally, the positional displacement which appears in the connection region between the right side circuit pattern and the left side circuit pattern includes positional displacement caused by a drawing position error upon pattern formation arising from a fabrication error on a mask and positional displacement which appears between divisional patterns caused by distortion or aberration arising from an optical system of an exposure apparatus or by deterioration and so forth of the measurement accuracy or array accuracy of a laser interferometer arising from the stage to which a wafer substrate is to be set. In other words, the positional displacement which is measured using the bar-in-bar marks 3 and 4 includes positional displacement caused by a drawing positional error as well as positional displacement arising from displacement of the stage or displacement in magnification upon exposure.

In contrast, if positional displacement measurement according to the procedure described above is carried out, then since the outer bar marks 3a and the inner bar marks 4b are disposed on one of two patterns positioned adjacent each other across the overlapping exposure region 2 while the inner bar marks 3b and the outer bar marks 4a which are to be combined with the outer bar marks 3a and the inner bar marks 4b, respectively, are disposed on the other of the two patterns and the bar-in-bar marks 3 and 4 are formed by combinations of the outer and inner bar marks 3a, 3b and 4a, 4b, by tentatively determining an average value of positional displacement amounts obtained from the bar-in-bar marks 3 and 4 as a positional displacement measurement result, the degree by which positional displacement measurement is carried out depending upon only one of the outer bar marks 3a and 4a can be suppressed. As a result, even if the mask patterns suffer from a fabrication error, it is possible to eliminate the influence of the error thereby to improve the accuracy in positional displacement measurement. In short, by disposing the outer bar marks 3a and 4a to be used as references for positional displacement measurement of the two patterns and averaging positional displacement amounts obtained from the bar-in-bar marks 3 and 4, measurement of connection accuracy which is not influenced by drawing positional displacement can be implemented.

After the positional displacement amounts obtained from the bar-in-bar marks 3 and 4 are averaged and the result of the calculation of the average value is tentatively considered as a positional displacement measurement result between the right side circuit pattern and the left side circuit pattern, correction of moving at least one of the right side circuit pattern and the left side circuit pattern is carried out so that the positional displacement measurement result may coincide with a predetermined value. In particular, when the positional displacement measurement result indicates a displacement amount greater than a tolerance set upon circuit pattern designing of a semiconductor device or indicates a value which can be corrected by the exposure apparatus, the positional displacement measurement result may be corrected, after the photoresist on the wafer substrate is removed, so as to coincide with "0" which is the predetermined value and exposure may be carried out in order to implement patterning connection with a high degree of accuracy. It is to be noted that, since the correction which is carried out in this instance may be carried out using a known method such as movement of the stage or correction of the magnification upon exposure of the exposure apparatus, detailed description of this is omitted herein.

Embodiment 1

Now, embodiments of the present invention are described particularly taking an example wherein a line-type sensor having a side of a dimension greater than the dimension of the field area of an exposure apparatus is fabricated as an example. The line-type sensor taken as an example here is fabricated, for example, through lithography steps A and B.

Figure 3:
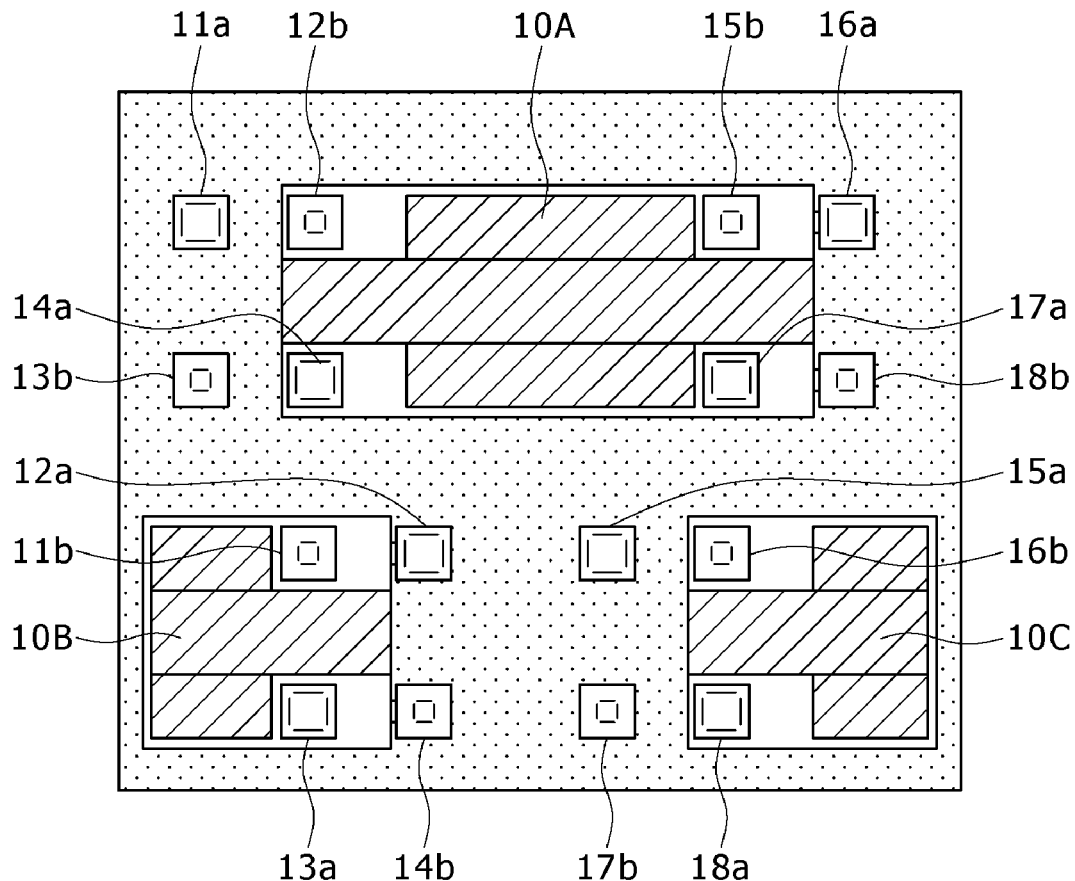
FIG. 3 is a schematic view showing a particular example of a mask pattern used in a lithography step for fabricating a line-type sensor.

FIG. 3 shows a particular example of a mask pattern used in the lithography step for fabricating a line-type sensor and shows the mask pattern A fabricated so that positional displacement of a connection region of the lithography step A can be measured.

On the mask pattern A shown in FIG. 3, a pattern 10A corresponding to a central portion of the line-type sensor, a pattern 10B corresponding to a left end portion of the line-type sensor and a pattern 10C corresponding to a right end portion of the line-type sensor are disposed. Mark portions 11a, 12b, 13b and 14a for forming a bar-in-bar mark are disposed on the left end side of the pattern 10A corresponding to the central portion while mark portions 15b, 16a, 17a and 18b for forming a bar-in-bar mark are disposed on the right end side of the pattern 10A. Further, mark portions 11b, 12a, 13a and 14b corresponding to the mark portions 11a, 12b, 13b and 14a, respectively, are disposed on the right end side of the pattern 10B which corresponds to the left end portion of the line-type sensor. Furthermore, mark portions 15a, 16b, 17b and 18a corresponding to the mark portions 15b, 16a, 17a and 18b, respectively are disposed on the left end side of the pattern 10C which corresponds to the right end portion of the line-type sensor.

Of the mark portions 11a to 14b, the mark portions 11b to 14b are disposed such that, when pattern portions 11 to 14 are exposure transferred to the connection region between the pattern 10A and the pattern 10B, the mark portion (outer bar mark) 11a and the mark portion (inner bar mark) 11b, the mark portion (inner bar mark) 12b and the mark portion (outer bar mark) 12a, the mark portion (inner bar mark) 13b and the mark portion (outer bar mark) 13a, and the mark portion (outer bar mark) 14a and the mark portion (inner bar mark) 14b may form a bar-in-bar mark. In particular, the mark portions 11a to 14b are disposed such that, when the pattern 10A and the pattern 10B are exposure transferred such that the left end side of the pattern 10A and the right end side of the pattern 10B overlap with each other, the center positions thereof individually coincide with each other. This similarly applies also to the mark portions 15a to 18b when the pattern 10A and the pattern 10C are exposure transferred such that the right end side of the pattern 10A and the left end side of the pattern 10C overlap with each other.

At the lithography step A, the mask pattern A described hereinabove is used to first carry out blind setting of the exposure apparatus so that the pattern 10A is transferred to a wafer substrate to form a photoresist pattern on the wafer substrate. Thereafter, the blind setting of the exposure apparatus is changed so that the pattern 10B is transferred and besides the wafer stage is moved so as to be positioned at a predetermined position, and then transfer is carried out. Also with regard to the pattern 10C, a resist pattern is formed on the wafer substrate in a similar manner.

Figure 4:
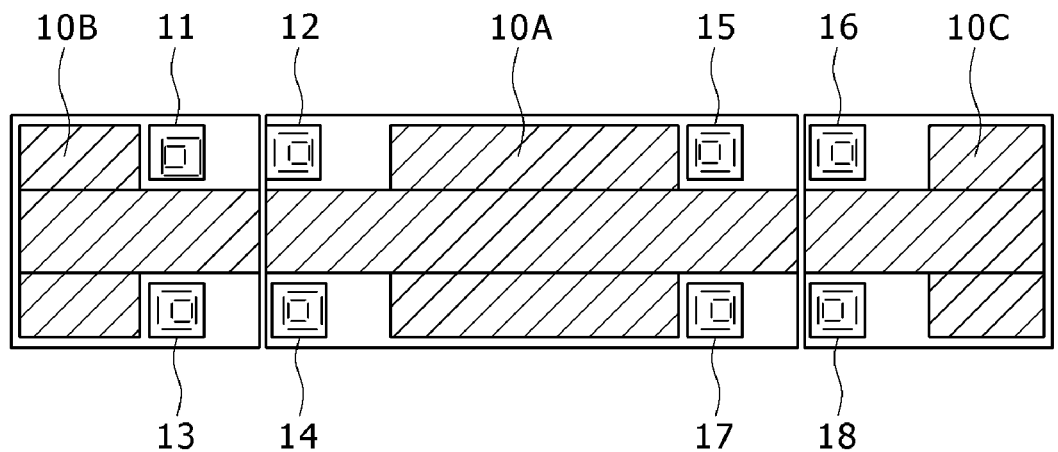
FIG. 4 is a schematic view showing a particular example of a transfer image obtained from the mask pattern of FIG. 3.

FIG. 4 illustrates a particular example of a transfer image obtained from the mask pattern of FIG. 3.

When exposure transfer of the patterns 10A to 10C to the wafer substrate is carried out at the lithography step A, the transfer image may suffer from positional displacement of the connection arising from a fabrication error of the mask, low accuracy of the stage of the exposure apparatus and so forth. In particular, for example, between the pattern 10A and the pattern 10B, appearance of positional displacement can be seen quantitatively because the center positions of the outer bar mark 11a and the inner bar mark 11b, the inner bar mark 12b and the outer bar mark 12a, the inner bar mark 13b and the outer bar mark 13a, and the outer bar mark 14a and the inner bar mark 14b do not coincide with each other.

The positional displacement in this instance includes displacement arising from the accuracy of the stage of the exposure apparatus and displacement from the accuracy in the mask pattern position of a mask drawing apparatus as described hereinabove. It is to be noted, however, that outer bar marks 11a, 12a, 13a and 14a to be used as a reference upon measurement of positional displacement are disposed on the opposite sides of the connection region. Accordingly, the displacement amounts arising from the accuracy in position of the mask patterns cancel each other to such a degree that they can be ignored by averaging the displacement amounts. In short, the positional displacement amounts arising from the masks can be reduced, and it becomes possible to calculate accurate connection accuracy of the original circuit pattern.

Similarly, by averaging the displacement amounts also between the pattern 10A and the pattern 10C, that is, between the inner bar mark 15b and the outer bar mark 15a, between the outer bar mark 16a and the inner bar mark 16b, between the outer bar mark 17a and the inner bar mark 17b and between the inner bar mark 18b and the outer bar mark 18a, the positional displacement amounts arising from the masks can be reduced, and it becomes possible to calculate accurate connection accuracy of the original circuit pattern.

FIG. 4 illustrates that the pattern 10B is displaced leftwardly with respect to the pattern 10A and the pattern 10C is displaced rightwardly with respect to the pattern 10A. In particular, for example, it is assumed that the positional displacement average value of the pattern 10B is X=−0.05 μm and the positional displacement average value of the pattern 10C is X=+0.04 μm.

In such an instance as just described, after the resist on the wafer substrate is removed, correction of adding an offset of X=+0.05 μm when re-exposure is carried out with regard to the pattern 10B and an offset of X=−0.04 μm when re-exposure is carried out with regard to the pattern 10C is carrier out. By this, the connection accuracy among the patterns 10A to 10C can be improved.

Figure 5:
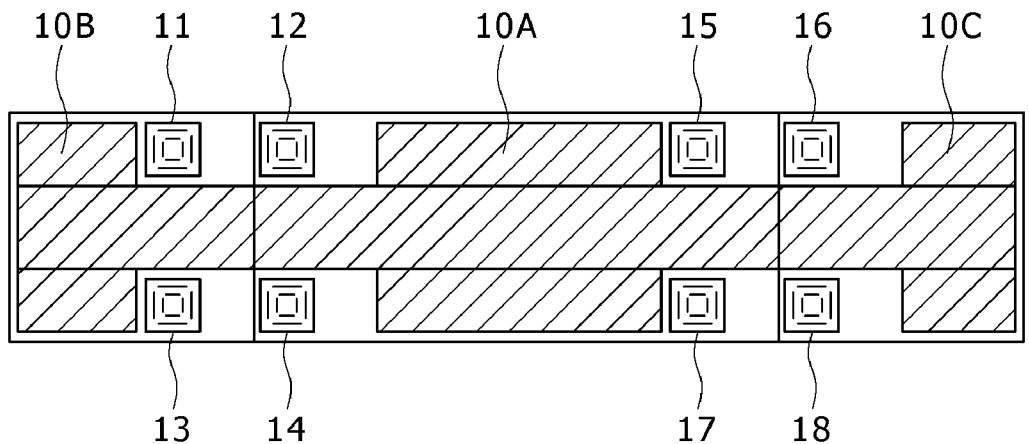
FIG. 5 is a schematic view illustrating a particular example of the transfer image after connection correction is carried out.

FIG. 5 shows a particular example of a transfer image after the connection correction is carried out.

After such a lithography step A as described above is completed, a next lithography step B is carried out after an etching step, a washing step, a film deposition step and so forth are carried out. In the lithography step B, alignment marks not shown formed in the lithography step A which is the preceding step are detected and an exposure process is carried out in an overlapping relationship with the circuit pattern formed at the lithography step A. It is to be noted that overlapping or alignment of the patterns may be carried out using a known technique, and therefore, detailed description thereof is omitted herein.

Figure 6:
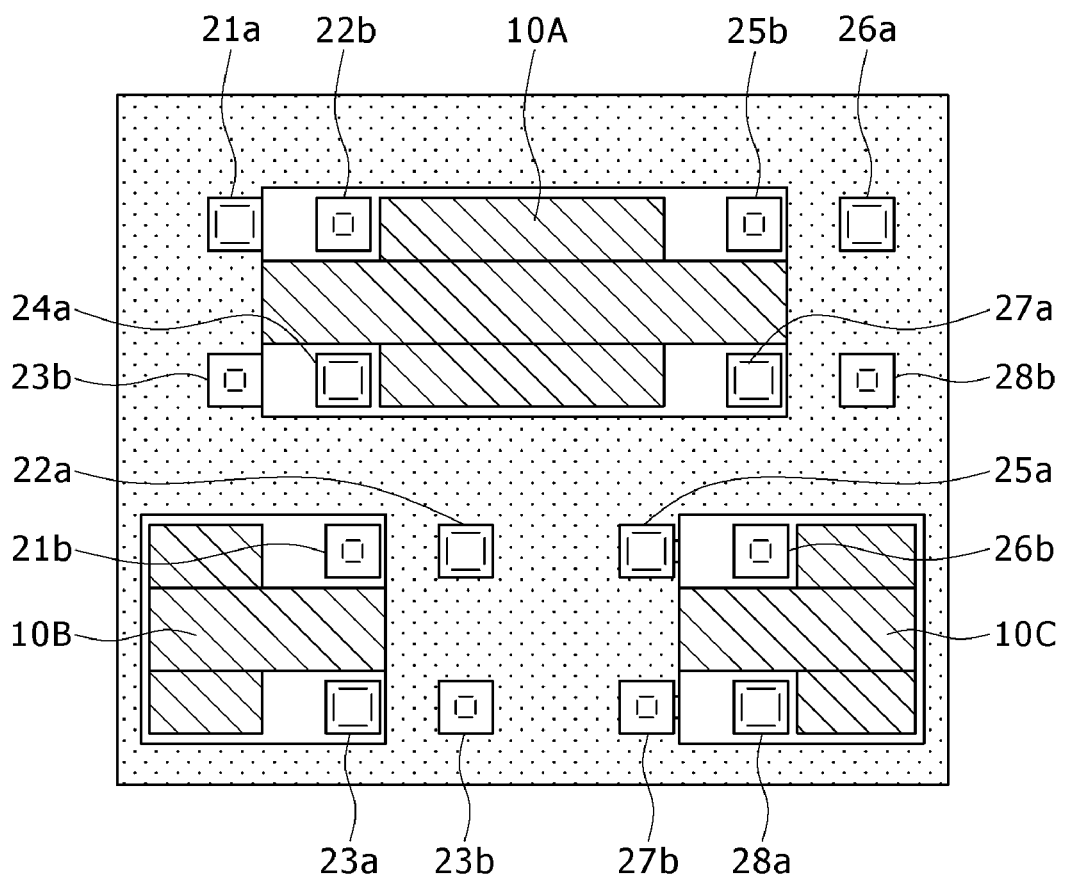
FIG. 6 is a schematic view showing another particular example of a mask pattern used in a lithography step for fabricating a line-type sensor.

FIG. 6 shows another particular example of a mask pattern used in a lithography step for fabricating a line-type sensor and shows a mask pattern B produced such that positional displacement of a connection region at the lithography step B can be measured.

Referring to FIG. 6, on the mask pattern B shown, mark portions 21a to 28b for forming bar-in-bar marks are disposed in such a manner as to avoid the formation positions of the bar-in-bar marks 11a to 18b for connection accuracy measurement in the lithography step A preceding to the lithography step B. Except this, the lithography step B is quite similar to the lithography step A. Thus, by averaging the displacement amounts between the outer bar mark 21a and the inner bar mark 21b, between the inner bar mark 22b and the outer bar mark 22a, between the outer bar mark 23a and the inner bar mark 23a and between the outer bar mark 24a and the inner bar mark 24b in the connection region between the pattern 10A and the pattern 10B, the positional displacement amounts arising from the masks can be reduced, and it becomes possible to calculate accurate connection accuracy of the original circuit pattern. Further, by averaging the displacement amounts between the inner bar mark 25b and the outer bar mark 25a, between the outer bar mark 26a and the inner bar mark 26b, between the outer bar mark 27a and the inner bar mark 27b and between the inner bar mark 28b and the outer bar mark 28a in the connection region between the pattern 10A and the pattern 10C, the positional displacement amounts arising from the masks can be reduced, and it becomes possible to calculate accurate connection accuracy of the original circuit pattern.

Figure 7:
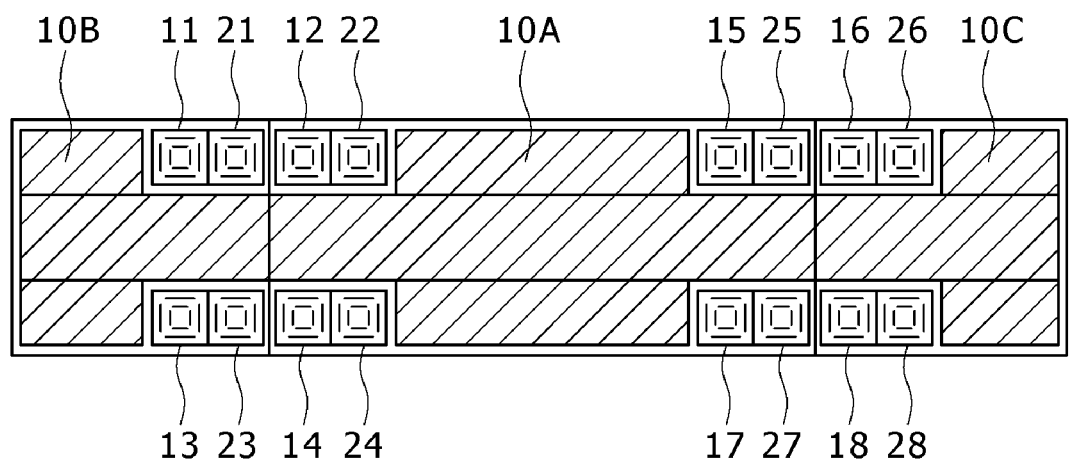
FIG. 7 is a schematic view showing an example of a transfer image obtained from the mask pattern of FIG. 6 after connection correction is carried out therefor.

FIG. 7 shows a particular example of a transfer image after the connection correction is carried out at the lithography step B. The transfer image shown in FIG. 7 is obtained by carrying out both of the lithography steps A and B.

Embodiment 2

Now, another embodiment of the present invention is described. Here, the present embodiment is described particularly taking fabrication of an area sensor for image pickup formed such that the sides thereof have a size greater than that of the field area of an exposure apparatus as an example. Such an area sensor as just described is fabricated by connecting two or more mask patterns to each other using an exposure apparatus to obtain one circuit pattern.

In the case of an area sensor, since the area of pixels is great, it is necessary to measure positional displacement of a connection region in the upward and downward direction of the connection area as well as in the leftward and rightward direction. Therefore, it is a possible idea to dispose two bar-in-bar marks at positions in the proximity of upper and lower ends of each mask pattern such that totaling four bar-in-bar marks are used.

Figure 8:
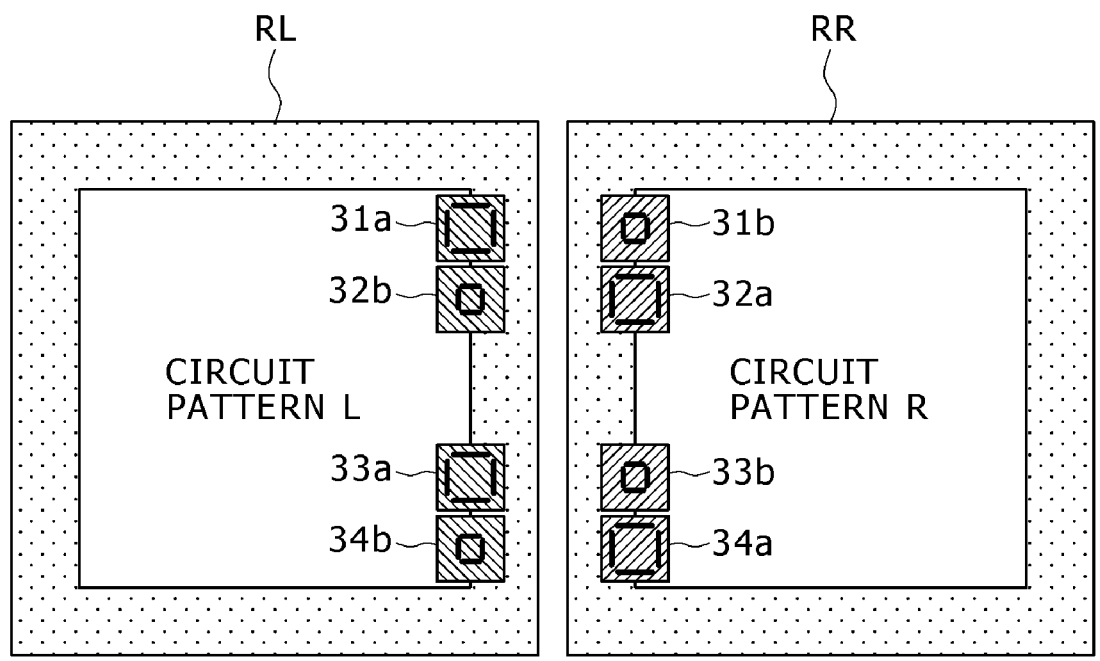
FIG. 8 is a schematic view showing a particular example of a mask pattern used in a lithography step for fabricating an area sensor.

FIG. 8 shows a particular example of mask patterns used in a lithography step for fabricating an area sensor.

For example, it is a possible idea to fabricate an area sensor designed with a size of 40 mm long and 20 mm high in the following manner. In particular, the area is divided into two left and right portions, and the left side circuit pattern L of the area sensor is disposed on a mask RL having a size of 20 mm long and 20 mm high while the right side circuit pattern R is disposed on another mask RR having a size of 20 mm long and 20 mm high. Then, the two masks RL and RR are connected to each other such that the lithography step as one step may be completed to fabricate an area sensor.

In this instance, outer bar marks 31a and 33a to be used as a reference for positional displacement measurement with respect to the mask RR and inner bar marks 32b and 34b for positional displacement measurement are disposed at positions in the proximity of upper and lower ends of the mask RL.

Further, outer bar marks 32a and 34a to be used as a reference for positional displacement measurement with respect to the mask RL and inner bar marks 31b and 33b for positional displacement measurement are disposed at positions in the proximity of upper and lower ends of the mask RR.

Of the marks 31a to 34b, the outer bar mark 31a of the mask RL and the inner bar mark 31b of the mask RR are disposed such that they overlap with each other with the center positions thereof registered with each other if the connection region on the wafer substrate does not have any positional displacement of the circuit patterns. Also the outer bar mark 32a and the inner bar mark 32b, the outer bar mark 33a and the inner bar mark 33b, and the outer bar mark 34a and the inner bar mark 34b on the mask RL and the mask RR are disposed similarly.

In the lithography step in which the two masks RL and RR are used, exposure by the exposure apparatus using the mask RL is carried out repetitively.

Figure 9:
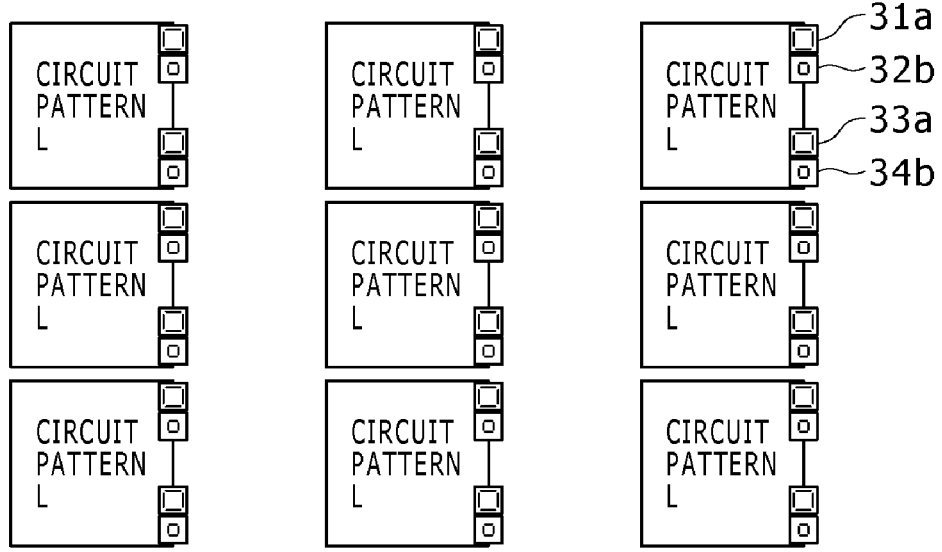
FIG. 9 is a schematic view showing a particular example of a transfer image which is a result of exposure transfer of a mask.

FIG. 9 shows a particular example of a transfer image which is a result of exposure transfer of the mask RL. In particular, FIG. 9 shows a transfer image obtained by successively transferring the patterns on the mask RL to a wafer substrate at intervals of, for example, 40.1 mm in the X direction and 20.1 mm in the Y direction.

After the exposure using the mask RL, exposure by the exposure apparatus using the mask RR is carried out repetitively.

Figure 10:
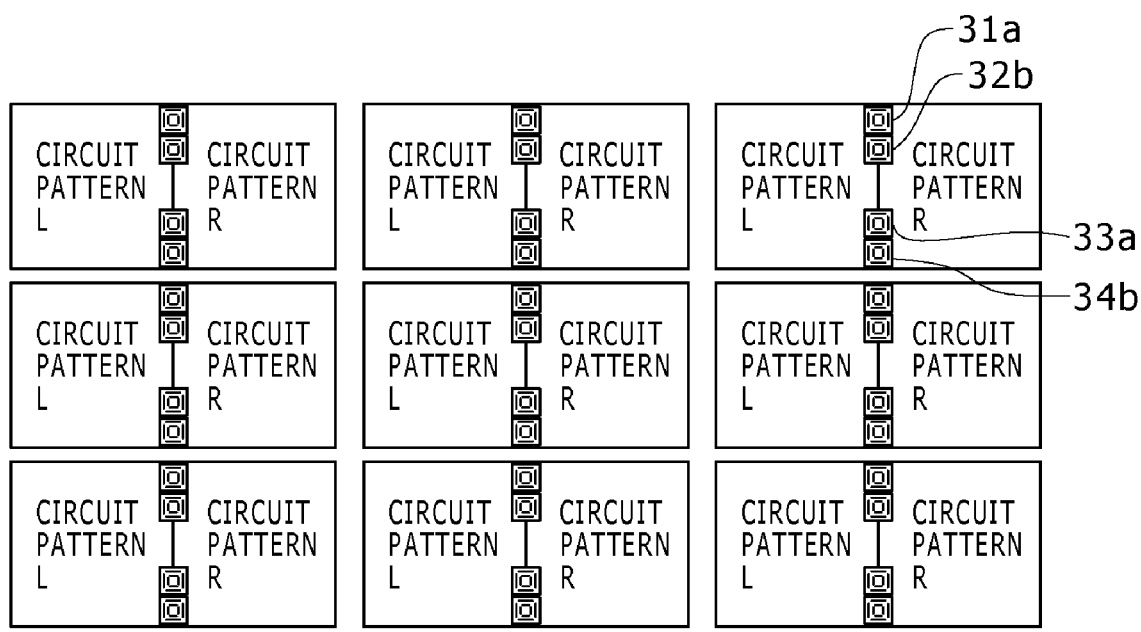
FIG. 10 is a schematic view showing a particular example of a transfer image as a result of exposure transfer using two masks.

FIG. 10 shows a particular example of a transfer image which is a result of the exposure transfer in which both of the mask RL and the mask RR are used. In particular, FIG. 10 shows a transfer image obtained by successively transferring the patterns on the mask RR to the wafer substrate at intervals of, for example, 40.1 mm in the X direction and 20.1 mm in the Y direction such that the patterns do not overlap with the patterns of the mask RL.

At this time, the transfer image on the wafer substrate suffers from positional displacement in the connection region arising from a factor of the optical system and a factor of the stage of the exposure apparatus similarly as in the case of the embodiment 1 described hereinabove.

However, as regards the positional displacement, by carrying out a calculation process similar to that in the first embodiment described hereinabove using the bar-in-bar mark 31 formed from a combination of the outer bar mark 31a and the inner bar mark 31b, the bar-in-bar mark 32 formed form a combination of the outer bar mark 32a and the inner bar mark 32b, the bar-in-bar mark 33 formed from a combination of the outer bar mark 33a and the inner bar mark 33b and the bar-in-bar mark 34 formed from a combination of the outer bar mark 34a and the inner bar mark 34b, the accurate connection accuracy of the original circuit patterns can be calculated in a state wherein the positional displacement amounts originating from the masks are reduced.

Accordingly, if re-exposure is carried out with the positional displacement amounts corrected after resist is removed from the wafer substrate or in a succeeding same lithography step, then the connection accuracy between the patterns from the mask RL and the patterns from the mask RR can be improved.

According to the embodiments 1 and 2 described hereinabove, highly accurate pattern connection can be implemented. Accordingly, it becomes possible to reduce the pattern margin of a connection region of a semiconductor device and implement a line-type sensor or an area sensor of a large area or a high pixel density. Further, where the pixel size is equal, by reducing the pattern margin of the connection region, the sensor area can be increased, and consequently it becomes possible to implement a line-type sensor or an area sensor having a high sensitivity.

It is to be noted that, while preferred embodiments of the present invention have been described above, the present invention is not limited to the substance of the description given above, but various modifications can be made.

For example, while the foregoing description is given principally of the lithography step which is one of fabrication steps of a semiconductor device, the present invention is not limited to techniques for fabrication of semiconductor devices but can be applied to any technique which uses an exposure apparatus and an original plate, which is, in the case of fabrication of semiconductor devices, a mask or a reticle, to obtain a transfer image of an area greater than one field of the exposure apparatus.

It should be understood by those skilled in the art that various modifications, combinations, sub-combinations and alterations may occur depending on design requirements and other factor in so far as they are within the scope of the appended claims or the equivalents thereof.

What is claimed is:

1. A method for fabricating a semiconductor device in which a plurality of mask patterns are used to form a pattern image of an area greater than the size of the mask patterns, the method comprising the steps of:
    (a) providing, on one mask pattern, a first pattern portion corresponding to a main mark of a first measurement mark formed from a combination of the main mark and a sub mark and a second pattern portion corresponding to a sub mark of a second measurement mark having a same configuration as that of the first measurement mark and positioned at a position different from that of the first measurement mark;
    (b) providing, on another mask pattern, a third pattern portion corresponding to the sub mark of the first measurement mark and a fourth pattern portion corresponding to the main mark of the second measurement mark;
    (c) carrying out exposure transfer of the one mask pattern using an exposure apparatus such that the first and second pattern portions respectively create measurement mark patterns within an overlapping exposure region to form the main mark of the first measurement mark and the sub-mark of the second measurement mark in the overlapping exposure region;
    (d) positioning the another mask pattern for exposure and measuring displacement of the positions of the third and fourth pattern portions of the another mask pattern relative to the main mark of the first measurement mark and the sub-mark of the second measurement mark, respectively; and
    (e) carrying out exposure transfer of the another mask pattern using the exposure apparatus such that the third and fourth pattern portions create measurement mark patterns within the overlapping exposure region to respectively form the sub-mark of the first measurement mark and the main mark of the second measurement mark within the overlapping exposure region.

2. The method of claim 1, further comprising the steps of:
    determining an average value of a displacement amount of the main mark and the sub mark of the first measurement mark and a displacement amount of the main mark and the sub mark of the second measurement mark; and
    correcting positioning of the another mask pattern by moving the another mask pattern relative to the measurement marks of the one mask pattern so that the average value may coincide with a predetermined value.

3. A lithography exposure method carried out using an exposure apparatus in which original patterns are connected to form a pattern image having a size greater than the size of the original patterns, the method comprising the steps of:
    (a) providing, on one mask pattern, a first pattern portion corresponding to a main mark of a first measurement mark formed from a combination of the main mark and a sub mark and a second pattern portion corresponding to a sub mark of a second measurement mark having a same configuration as that of the first measurement mark and positioned at a position different from that of the first measurement mark;

(b) providing, on another mask pattern, a third pattern portion corresponding to the sub mark of the first measurement mark and a fourth pattern portion corresponding to the main mark of the second measurement mark;
(c) carrying out exposure transfer of the one mask pattern using an exposure apparatus such that the first and second pattern portions respectively create measurement mark patterns within an overlapping exposure region to form the main mark of the first measurement mark and the sub-mark of the second measurement mark in the overlapping exposure region;
(d) positioning the another mask pattern for exposure and measuring displacement of the positions of the third and fourth pattern portions of the another mask pattern relative to the main mark of the first measurement mark and the sub-mark of the second measurement mark, respectively; and
(e) carrying out exposure transfer of the another mask pattern using the exposure apparatus such that the third and fourth pattern portions create measurement mark patterns within the overlapping exposure region to respectively form the sub-mark of the first measurement mark and the main mark of the second measurement mark within the overlapping exposure region.

4. A pattern correction method, carried out using a lithography exposure apparatus, in which a pattern image of a size greater than the size of original patterns by connection of the original patterns is transferred by exposure, the method comprising the steps of:
(a) providing, on one mask pattern, a first pattern portion corresponding to a main mark of a first measurement mark formed from a combination of the main mark and a sub mark and a second pattern portion corresponding to a sub mark of a second measurement mark having a same configuration as that of the first measurement mark and positioned at a position different from that of the first measurement mark;
b) providing, on another mask pattern, a third pattern portion corresponding to the sub mark of the first measurement mark and a fourth pattern portion corresponding to the main mark of the second measurement mark;
(c) carrying out exposure transfer of the one mask pattern using an exposure apparatus such that the first and second pattern portions respectively create measurement mark patterns within an overlapping exposure region to form the main mark of the first measurement mark and the sub-mark of the second measurement mark in the overlapping exposure region;
(d) positioning the another mask pattern for exposure and measuring displacement of the positions of the third and fourth pattern portions of the another mask pattern relative to the main mark of the first measurement mark and the sub-mark of the second measurement mark, respectively; and
(e) carrying out exposure transfer of the another mask pattern using the exposure apparatus such that the third and fourth pattern portions create measurement mark patterns within the overlapping exposure region to respectively form the sub-mark of the first measurement mark and the main mark of the second measurement mark within the overlapping exposure region wherein step (d) further comprises
(1) determining an average value of a displacement amount of the main mark and the sub mark of the first measurement mark and a displacement amount of the main mark and the sub mark of the second measurement mark, both obtained by the positional displacement measurement, and
(2) correcting positioning of the another mask pattern by moving the another mask pattern relative to the measurement marks of the one mask pattern so that the average value coincides with a predetermined value.

5. A semiconductor device obtained using a lithography process of connecting a plurality of mask patterns to form a pattern image of an area greater than the size of the mask patterns, the lithography process carried out using a lithography exposure apparatus and including the steps of:
(a) providing, on one mask pattern, a first pattern portion corresponding to a main mark of a first measurement mark formed from a combination of the main mark and a sub mark and a second pattern portion corresponding to a sub mark of a second measurement mark having a same configuration as that of the first measurement mark and positioned at a position different from that of the first measurement mark;
(b) providing, on another mask pattern, a third pattern portion corresponding to the sub mark of the first measurement mark and a fourth pattern portion corresponding to the main mark of the second measurement mark;
(c) carrying out exposure transfer of the one mask pattern using an exposure apparatus such that the first and second pattern portions respectively create measurement mark patterns within an overlapping exposure region to form the main mark of the first measurement mark and the sub-mark of the second measurement mark in the overlapping exposure region;
(d) positioning the another mask pattern for exposure and measuring displacement of the positions of the third and fourth pattern portions of the another mask pattern relative to the main mark of the first measurement mark and the sub-mark of the second measurement mark, respectively;
(e) carrying out exposure transfer of the another mask pattern using the exposure apparatus such that the third and fourth pattern portions create measurement mark patterns within the overlapping exposure region to respectively form the sub-mark of the first measurement mark and the main mark of the second measurement mark within the overlapping exposure region,
wherein step (d) further comprises
(1) determining an average value of a displacement amount of the main mark and the sub mark of the first measurement mark and a displacement amount of the main mark and the sub mark of the second measurement mark, both obtained by the positional displacement measurement, and
(2) correcting positioning of the another mask pattern by moving the another mask pattern relative to the measurement marks of the one mask pattern so that the average value coincides with a predetermined value.

* * * * *